United States Patent
Kawasaki et al.

(10) Patent No.: US 10,639,749 B2
(45) Date of Patent: *May 5, 2020

(54) CU CORE BALL, SOLDER JOINT, SOLDER PASTE AND FORMED SOLDER

(71) Applicant: Senju Metal Industry Co., Ltd., Tokyo (JP)

(72) Inventors: Hiroyoshi Kawasaki, Tokyo (JP); Shigeki Kondoh, Tochigi (JP); Hiroki Sudo, Tochigi (JP); Masato Tsuchiya, Tochigi (JP); Takashi Yashima, Tochigi (JP); Takahiro Roppongi, Tochigi (JP); Daisuke Soma, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/435,776

(22) Filed: Jun. 10, 2019

(65) Prior Publication Data
US 2019/0375054 A1    Dec. 12, 2019

(30) Foreign Application Priority Data
Jun. 12, 2018   (JP) ................................. 2018-111872

(51) Int. Cl.
*B23K 35/02*   (2006.01)
*B23K 35/30*   (2006.01)
(Continued)

(52) U.S. Cl.
CPC .............. *B23K 35/302* (2013.01); *B22F 1/00* (2013.01); *B22F 1/0048* (2013.01);
(Continued)

(58) Field of Classification Search
CPC ........ B22F 1/00; B22F 1/0048; B22F 1/0085; B22F 1/025; B22F 1/02; B22F 1/0081;
(Continued)

(56) References Cited

U.S. PATENT DOCUMENTS 9,668,358 B2   5/2017   Kawasaki et al.
10,137,535 B2  11/2018  Kawasaki et al.
(Continued)

FOREIGN PATENT DOCUMENTS

JP    5435182 B1   3/2014
JP    5585751 B1   9/2014
(Continued)

*Primary Examiner* — Michael E. La Villa
(74) *Attorney, Agent, or Firm* — The Webb Law Firm

(57) ABSTRACT

The Cu core ball contains a Cu ball and one or more metal layer for covering a surface of the Cu ball, each layer including one or more element selected from Ni, Co, Fe and Pd. The Cu ball contains at least one element selected from Fe, Ag, and Ni in a total amount of 5.0 or more to 50.0 ppm by mass or lower, S in an amount of 0 ppm by mass or more to 1.0 ppm by mass or lower, P in an amount of 0 ppm by mass or more to less than 3.0 ppm by mass, and remainder of Cu and inevitable impurities. The Cu ball contains purity which is 99.995% by mass or higher and 99.9995% or lower, sphericity which is 0.95 or higher and a diameter of 1 μm or more to 1000 μm or lower.

16 Claims, 3 Drawing Sheets

(51) Int. Cl.
| | |
|---|---|
| B22F 1/00 | (2006.01) |
| B22F 1/02 | (2006.01) |
| H01L 23/00 | (2006.01) |
| H01L 23/498 | (2006.01) |
| C23C 30/00 | (2006.01) |
| C22C 9/00 | (2006.01) |
| C22C 9/06 | (2006.01) |
| C23C 28/02 | (2006.01) |
| C22C 9/02 | (2006.01) |
| C23C 28/00 | (2006.01) |
| C22C 13/00 | (2006.01) |
| B32B 15/01 | (2006.01) |
| B32B 15/04 | (2006.01) |
| B23K 35/26 | (2006.01) |
| B23K 35/365 | (2006.01) |
| B23K 35/36 | (2006.01) |
| G01N 21/956 | (2006.01) |
| G01N 21/95 | (2006.01) |
| G01N 21/25 | (2006.01) |

(52) U.S. Cl.
CPC .......... *B22F 1/0081* (2013.01); *B22F 1/0085* (2013.01); *B22F 1/02* (2013.01); *B22F 1/025* (2013.01); *B23K 35/025* (2013.01); *B23K 35/0227* (2013.01); *B23K 35/0238* (2013.01); *B23K 35/0244* (2013.01); *B23K 35/262* (2013.01); *B23K 35/3033* (2013.01); *B23K 35/3046* (2013.01); *B23K 35/3602* (2013.01); *B23K 35/365* (2013.01); *B32B 15/01* (2013.01); *B32B 15/04* (2013.01); *B32B 15/043* (2013.01); *C22C 9/00* (2013.01); *C22C 9/02* (2013.01); *C22C 9/06* (2013.01); *C22C 13/00* (2013.01); *C23C 28/00* (2013.01); *C23C 28/02* (2013.01); *C23C 28/021* (2013.01); *C23C 28/023* (2013.01); *C23C 30/00* (2013.01); *C23C 30/005* (2013.01); *G01N 21/25* (2013.01); *G01N 21/951* (2013.01); *G01N 21/95684* (2013.01); *H01L 23/49816* (2013.01); *H01L 24/11* (2013.01); *H01L 24/13* (2013.01); *H01L 24/16* (2013.01); *H01L 24/81* (2013.01); *G01N 2021/95646* (2013.01); *H01L 2224/13016* (2013.01); *H01L 2224/13582* (2013.01); *H01L 2224/13611* (2013.01); *H01L 2224/13655* (2013.01); *H01L 2224/13657* (2013.01); *H01L 2224/16227* (2013.01); *H01L 2224/81815* (2013.01); *H01L 2924/15311* (2013.01); *H01L 2924/20105* (2013.01); *Y10T 428/12014* (2015.01); *Y10T 428/12028* (2015.01); *Y10T 428/1291* (2015.01); *Y10T 428/12104* (2015.01); *Y10T 428/12222* (2015.01); *Y10T 428/12229* (2015.01); *Y10T 428/12493* (2015.01); *Y10T 428/12708* (2015.01); *Y10T 428/12715* (2015.01); *Y10T 428/12722* (2015.01); *Y10T 428/12875* (2015.01); *Y10T 428/12903* (2015.01); *Y10T 428/12917* (2015.01); *Y10T 428/12924* (2015.01); *Y10T 428/12931* (2015.01); *Y10T 428/12937* (2015.01); *Y10T 428/12944* (2015.01); *Y10T 428/12993* (2015.01); *Y10T 428/2495* (2015.01); *Y10T 428/26* (2015.01); *Y10T 428/29* (2015.01); *Y10T 428/2982* (2015.01); *Y10T 428/2991* (2015.01)

(58) Field of Classification Search
CPC ........ H01L 24/13; H01L 24/11; H01L 24/16; H01L 24/81; H01L 2924/15311; H01L 2924/20105; H01L 2924/37001; H01L 23/49816; H01L 2224/13657; H01L 2224/13655; H01L 2224/13611; H01L 2224/13582; H01L 2224/13016; H01L 2224/16227; H01L 2224/81815; C22C 13/00; C22C 9/00; C22C 9/02; C22C 9/06; C23C 28/02; C23C 28/021; C23C 28/00; C23C 30/00; C23C 30/005; C23C 28/023; B32B 15/01; B32B 15/04; B32B 15/043; B23K 35/365; B23K 35/3602; B23K 35/302; B23K 35/262; B23K 35/025; B23K 35/0244; B23K 35/3033; B23K 35/3046; B23K 35/0227; B23K 35/0238; G01N 21/951; G01N 21/95684; G01N 2021/95646; G01N 21/25; Y10T 428/12222; Y10T 428/12229; Y10T 428/12493; Y10T 428/12708; Y10T 428/12715; Y10T 428/12722; Y10T 428/12931; Y10T 428/12937; Y10T 428/12944; Y10T 428/12993; Y10T 428/12014; Y10T 428/12028; Y10T 428/12104; Y10T 428/12903; Y10T 428/1291; Y10T 428/12917; Y10T 428/12924; Y10T 428/12985; Y10T 428/2495; Y10T 428/26; Y10T 428/29; Y10T 428/2982; Y10T 428/2991; Y10T 428/12875

See application file for complete search history.

(56) References Cited

U.S. PATENT DOCUMENTS

| | | | |
|---|---|---|---|
| 2017/0246711 A1* | 8/2017 | Kawasaki | ................ C22F 1/08 |
| 2017/0312860 A1* | 11/2017 | Hattori | ................ C22C 13/00 |
| 2018/0056451 A1 | 3/2018 | Wakano | |
| 2019/0375053 A1* | 12/2019 | Kawasaki | ............ B22F 1/0048 |

FOREIGN PATENT DOCUMENTS

| | | |
|---|---|---|
| JP | 6256616 B2 | 1/2018 |
| JP | 6341330 B1 | 6/2018 |

* cited by examiner

[FIG. 1]
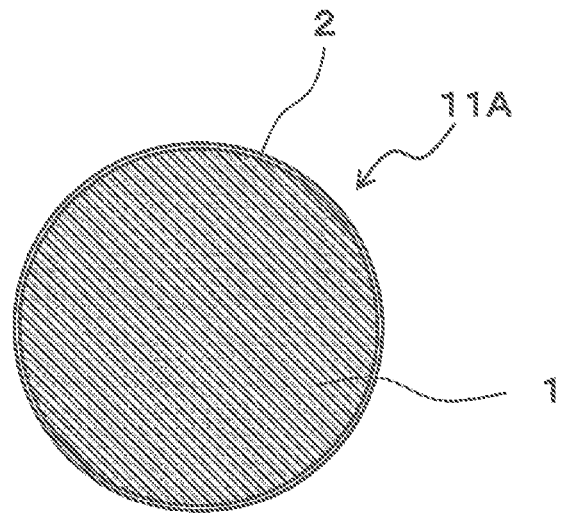
[FIG. 2]
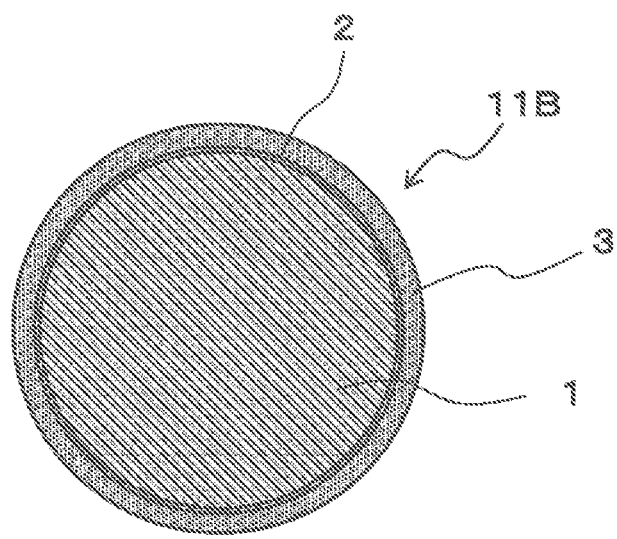

[FIG. 3]
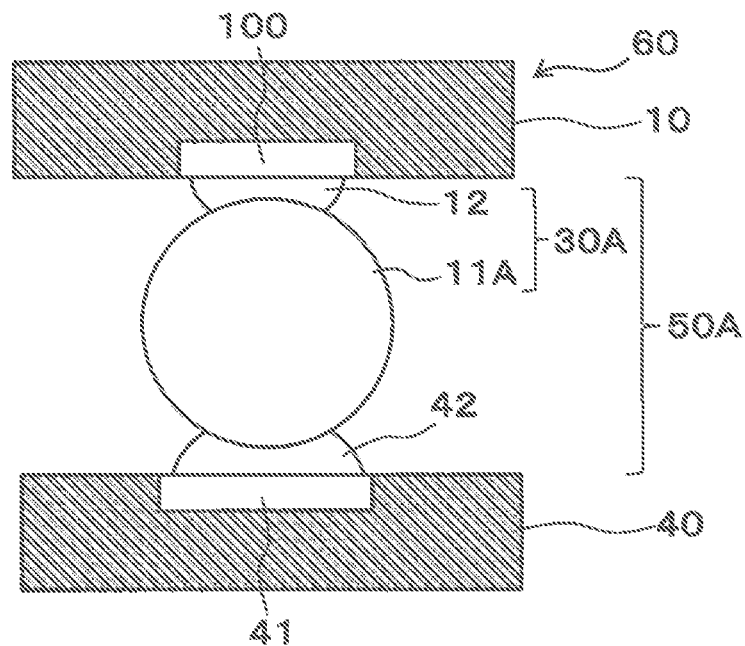
[FIG. 4]
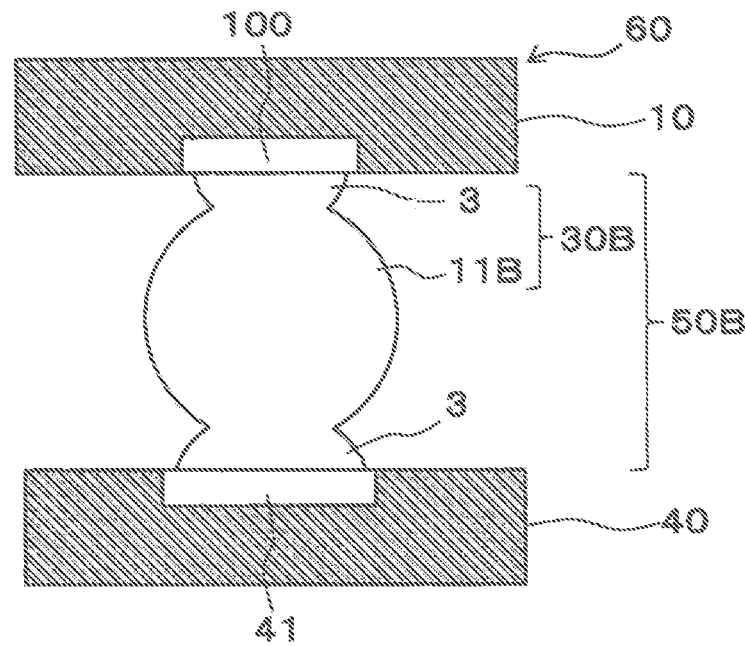

[FIG. 5]
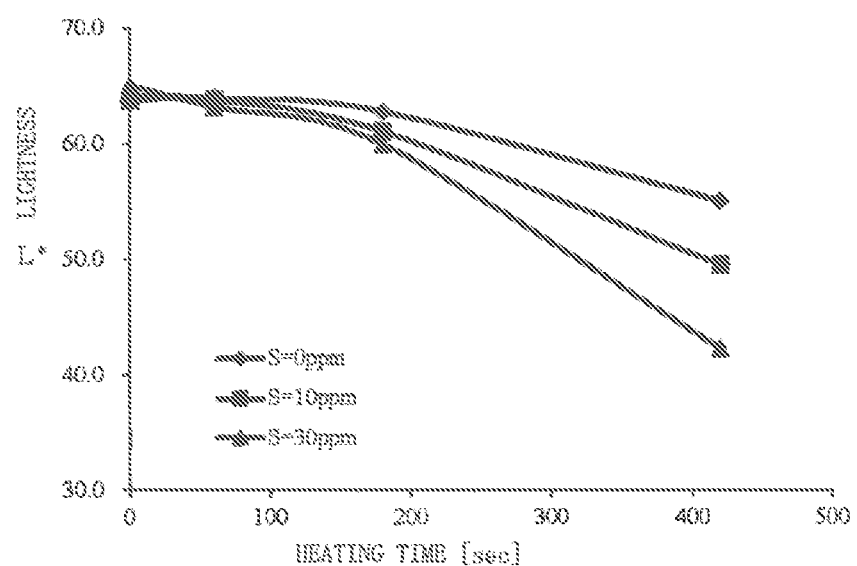

CU CORE BALL, SOLDER JOINT, SOLDER PASTE AND FORMED SOLDER

CROSS REFERENCE TO RELATED APPLICATION

This application claims priority to Japanese Patent Application JP 2018-111872 filed Jun. 12, 2018, the disclosure of which is hereby incorporated by reference in its entirety.

BACKGROUND OF THE INVENTION

Field of the Invention

The present invention relates to a Cu core ball in which a metal layer(s) cover(s) a Cu ball, a solder joint using the Cu core ball, solder paste using the same and formed solder using the same.

Description of Related Art

Recently, along development of compact information equipment, electronic components to be mounted have been downsized rapidly. A ball grid alley (hereinafter referred to as "BGA") having electrodes at its rear surface has been applied to such electronic components in order to cope with a narrowed connection terminal and a reduced mounting area because of the downsizing requirement.

As the electronic components to which the BGA is applied, for example, a semiconductor package is exemplified. In the semiconductor package, semiconductor chips having electrodes are sealed with resin. Solder bumps are formed on the electrodes of the semiconductor chips. This solder bump is formed by joining a solder ball to an electrode of the semiconductor chip. The semiconductor package to which the BGA is applied is mounted on a printed circuit board by joining the solder bump melted by the heating to a conductive land of the printed circuit board. Additionally, a three-dimensional high-density mounting structure has been studied by stacking up the semiconductor packages in a height direction in order to meet the further high-density mounting requirement.

Such a high-density mounting structure of the electronic components, however, may cause any soft errors in which memory contents are rewritten when alpha rays enter into a memory cell of a semiconductor integral circuit (IC). Accordingly, solder materials with low alpha rays or a Cu ball with low alpha rays, which has decreased contents of a radioisotope, have been recently developed. Japanese Patent No. 5435182 discloses a Cu ball with low alpha rays, which contains Pb and Bi and has a purity which is 99.9% or higher to 99.995% or lower. Japanese Patent No. 5585751 discloses a Cu ball that has a purity which is 99.9% or higher to 99.995% or lower, has sphericity which is 0.95 or higher and has the Vickers hardness which is 20 HV or higher to 60 HV or lower.

By the way, since the Vickers hardness of the Cu ball is large when its crystal grains is fine, its durability against external stress is made inferior and its impact resistance to dropping is also deteriorated. Therefore, any predetermined softness, namely, the Vickers hardness which is equal to or lower than a predetermined value thereof may be required for the Cu ball to be used for mounting the electronic components.

For manufacturing the soft Cu ball, it is a general practice to increase purity of Cu. This is because the crystal grains grow up largely when there is a small amount of impurity elements since the impurity elements function as a crystal core in the Cu ball, so that the Vickers hardness of the Cu ball decreases. When increasing the purity of the Cu ball, however, the sphericity of the Cu ball decreases.

In a case of low sphericity of the Cu ball, there may be cases where a self-alignment property of the Cu balls cannot be possibly maintained when the Cu balls are installed on the electrodes and unevenness in heights of the Cu balls occur when mounting a semiconductor chip, thereby causing any bonding defect.

Japanese Patent No. 6256616 discloses a Cu ball that contains Cu exceeding 99.995% by mass, has a total amount of P and S which is 3 ppm by mass or higher to 30 ppm by mass or lower and has a preferable sphericity and Vickers hardness.

SUMMARY OF THE INVENTION

It, however, has been newly founded that a Cu ball containing at least a predetermined amount of S forms a sulfide or a sulfur oxide when heating the ball so that it is easy to discolor. The discoloration of the Cu ball may cause the wettability thereof to deteriorate and the deterioration of the wettability may lead to a generation of a condition that it is not wetted or cause a self-alignment property thereof to deteriorate. Thus, since, in the Cu ball which is easy to discolor, for example, an adhesion between a surface of the Cu ball and a metal layer becomes worse and the metal layer has a high oxidizable surface or a surface with high reactivity, such a Cu ball is not suitable for being coated by the metal layer. On the other hand, when a sphericity of the Cu ball is low, a sphericity of a Cu core ball in which the metal layer covers the Cu ball is also low.

Accordingly, in order to address the above-described issues, the present invention has an object to provide a Cu core ball in which the metal layer covers a Cu ball which realizes a high sphericity and a low hardness and suppresses the discoloration, a solder joint using the Cu core ball, solder paste using the same and formed solder using the same.

To achieve the above-mentioned object, a Cu core ball contains a Cu ball, and one or more metal layer for covering a surface of the Cu ball. Each layer includes one or more element selected from a group of Ni, Co, Fe and Pd. The Cu ball contains at least one element selected from a group of Fe, Ag and Ni in a total amount of 5.0 ppm by mass or more to 50.0 ppm by mass or lower, S in an amount of 0 ppm by mass or more to 1.0 ppm by mass or lower, P in an amount of 0 ppm by mass or more to less than 3.0 ppm by mass, and remainder of Cu and inevitable impurities. The Cu ball contains purity which is 99.995% by mass or higher to 99.9995% by mass or lower, and sphericity which is 0.95 or higher. The Cu ball contains a diameter of 1 μm or more to 1000 μm or lower. The Cu core ball further contains a solder layer which covers a surface of the metal layer wherein the sphericity thereof is 0.95 or higher.

A solder joint, solder paste and formed solder respectively use the above Cu core balls.

According to the present invention, the Cu ball having a high sphericity and a low hardness is realized and the discoloration thereof is suppressed. It is capable of realize a high sphericity of the Cu core ball in which a metal layer covers the Cu ball by realizing the high sphericity of the Cu ball. It is possible to maintain a self-alignment property when installing the Cu core balls on the electric electrodes and to prevent the Cu core balls from varying in the heights thereof. In addition, it is capable of improving impact resistance to dropping in the Cu core ball in which a metal layer covers the Cu ball by realizing the low hardness of the Cu ball. Further, since the discoloration of the Cu ball is suppressed, it is possible to prevent the Cu ball from being adversely affected by any sulfide or sulfur oxide, thereby being suitable for being coated by the metal layer and improving a wettability thereof.

BRIEF DESCRIPTION OF THE DRAWINGS

Other objects and attainments of the present invention will be become apparent to those skilled in the art upon a reading of the following detailed description when taken in conjunction with the drawing.

FIG. 1 is a diagram of a Cu core ball according to a first embodiment of the prevent invention for illustrating a configuration example thereof.

FIG. 2 is a diagram of a Cu core ball according to a second embodiment of the prevent invention for illustrating a configuration example thereof.

FIG. 3 is a diagram of an electronic component using the Cu core ball according to the first embodiment of the prevent invention for illustrating a configuration example thereof.

FIG. 4 is a diagram of an electronic component using the Cu core ball according to the second embodiment of the prevent invention for illustrating a configuration example thereof.

FIG. 5 is a graph showing a relationship between lightness and heating time when heating the Cu balls of Executed Examples and Comparison Examples at 200 degrees C.

DESCRIPTION OF THE PREFERRED EMBODIMENTS

The following will describe the present invention in detail. In this specification, units (such as ppm, ppb and %) relating to composition in the metal layer of the Cu core ball represent ratios to mass of the metal layer (ppm by mass, ppb by mass and % by mass) unless otherwise specified. In addition, units (such as ppm, ppb and %) relating to composition of the Cu ball represent ratios to mass of the Cu ball (ppm by mass, ppb by mass and % by mass) unless otherwise specified.

FIG. 1 shows a configuration example of a Cu core ball 11A according to a first embodiment of the prevent invention. As shown in FIG. 1, the Cu core ball 11A contains a Cu ball 1 and one or more metal layer 2 for covering a surface of the Cu ball 1, each layer including one or more element selected from the group of Ni, Co, Fe and Pd.

FIG. 2 shows a configuration example of a Cu core ball 11B according to a second embodiment of the prevent invention. As shown in FIG. 2, the Cu core ball 11B contains a Cu ball 1, one or more metal layer 2 that covers a surface of the Cu ball 1, each layer including one or more element selected from the group of Ni, Co, Fe and Pd and a solder layer 3 that covers a surface of the metal layer 2.

FIG. 3 shows a configuration example of an electronic component 60 in which a semiconductor chip 10 is mounted on a printed circuit board 40 using the Cu core ball 11A according to the first embodiment of the prevent invention. As shown in FIG. 3, the Cu core ball 11A is installed on an electrode 100 of the semiconductor chip 10 via solder paste 12. In this example, a structure in which the Cu core ball 11A is installed on the electrode 100 of the semiconductor chip 10 is called a solder bump 30A. Solder paste 42 is printed on an electrode 41 of the printed circuit board 40. The solder bump 30A of the semiconductor chip 10 is connected on the electrode 41 of the printed circuit board 40 via the solder paste 42. In this example, a structure in which the solder bump 30A is mounted on the electrode 41 of the printed circuit board 40 is called a solder joint 50A.

FIG. 4 shows a configuration example of an electronic component 60 in which a semiconductor chip 10 is mounted on a printed circuit board 40 using the Cu core ball 11B according to the second embodiment of the prevent invention. As shown in FIG. 4, the Cu core ball 11B is installed on an electrode 100 of the semiconductor chip 10 by applying flux to the electrode 100 of the semiconductor 10 to wetly spread out the molten solder layer 3. In this example, a structure in which the Cu core ball 11B is installed on the electrode 100 of the semiconductor chip 10 is called a solder bump 30B. The solder bump 30B of the semiconductor chip 10 is connected on the electrode 41 of the printed circuit board 40 via the molten solder layer 3 or the solder paste applied to an electrode 41. In this example, a structure in which the solder bump 30B is mounted on the electrode 41 of the printed circuit board 40 is called a solder joint 50B.

In each of the Cu core balls 11A, 11B of the embodiments, the Cu ball 1 contains at least one element selected from a group of Fe, Ag and Ni in a total amount of 5.0 ppm by mass or more to 50.0 ppm by mass or lower, S in an amount of 0 ppm by mass or more to 1.0 ppm by mass or lower, P in an amount of 0 ppm by mass or more to less than 3.0 ppm by mass, and remainder of Cu and inevitable impurities. The Cu ball contains purity which is 99.995% (4N5) by mass or higher to 99.9995% (5N5) by mass or lower, and sphericity which is 0.95 or higher.

In the Cu core ball 11A of the first embodiment of the present invention, the high sphericity of the Cu ball which the metal layer 2 covers enables the sphericity of the Cu core ball 11A to be increased. In the Cu core ball 11B of the second embodiment of the present invention, the high sphericity of the Cu ball which the metal layer 2 and the solder layer 3 cover also enables the sphericity of the Cu core ball 11B to be increased. The following will describe a preferred embodiment of the Cu ball 1 constituting each of the Cu core balls 11A, 11B.

<Sphericity of Cu Ball: 0.95 or Higher>

In the present invention, the sphericity represents a gap from a true sphere. The sphericity is an arithmetic mean value calculated by dividing a diameter of each of 500 Cu balls by a length of the longest axis of each Cu ball. When a value thereof is closer to the upper limit 1.00, this is closer to the true sphere. The sphericity can be determined by various kinds of methods, for example, a least squares center method (LSC method), a minimum zone center method (MZC method), a maximum inscribed center method (MIC method), a minimum circumscribed center method (MCC method), etc. In this invention, the length of the diameter and the length of the longest axis are referred to as lengths measured by measuring equipment, ultra-quick vision, ULTRA QV 350-PRO manufactured by Mitsutoyo Corporation.

For the Cu ball 1, the sphericity is preferably 0.95 or higher, in terms of maintaining an appropriate space between the substrates, is more preferably 0.98 or higher, and is most preferably 0.99 or higher. When the sphericity of the Cu ball 1 is less than 0.95, the Cu ball 1 becomes an indeterminate shape. Therefore, bumps having uneven heights are formed at the bump formation time and the possibility that poor joints occur is increased. When the sphericity is 0.95 or higher, it is possible to restrain variation of the heights in the solder joints 50A, 50B because the Cu ball 1 does not melt at a soldering temperature. Therefore, it is surely possible to prevent the poor joints between the semiconductor chip 10 and the printed circuit board 40 from occurring.

<Purity of Cu Ball: 99.995% by Mass or Higher to 99.9995% by Mass or Lower>

Cu having lower purity generally has higher sphericity, as compared with the Cu having higher purity, because such Cu having lower purity can contain any impurity elements which form a crystal core of the Cu ball 1. On the other hand, the Cu ball 1 having reduced purity has poor electric conductivity and thermal conductivity. In addition, a Cu ball using Cu having higher purity has a low hardness.

Accordingly, when the purity in the Cu ball 1 is 99.995% (4N5) by mass or higher to 99.9995% (5N5) by mass or lower, a sufficient sphericity of the Cu ball 1 can be maintained. In addition, when the purity in the Cu ball 1 is within this range, the alpha dose is sufficiently decreased and the degradation of the electrical conductivity and thermal conductivity of the Cu ball 1 based on the reduced purity is also suppressed.

When manufacturing the Cu ball 1, the Cu material is formed into a predetermined shaped chip and is melted by heating. The molten Cu then becomes a spherical form with its surface tension. It is solidified by rapid cooling to become the Cu ball 1. At a process of solidifying the molten Cu from its liquid state, a crystal grain grows up in the molten Cu of the spherical form. In this process, if there are a lot of impurity elements, they become the crystal cores and prevent the crystal grain from growing. Accordingly, the molten Cu of the spherical form becomes the Cu ball 1 having the high sphericity with the fine crystal grains that are prevented from growing up. On the other hand, if the number of impurity elements is less, then the crystal cores are relatively less formed. They grow up in a directional property without suppressing the grain growth. As a result thereof, a part of the surface of the molten Cu with the spherical form protrudes and solidifies. The sphericity of such a Cu ball 1 is low. It is conceivable that the impurity elements may be Fe, Ag, Ni, P, S, Sb, Bi, Zn, Al, As, Cd, Pb, In, Sn, Au, U, Th, etc.

The following will describe the purity of the Cu ball 1 and contents of the impurities that limits the sphericity.

<Total Amount of at Least One Element Selected from a Group of Fe, Ag and Ni: 5.0 ppm by Mass or More to 50.0 ppm by Mass or Lower>

It is preferable that a total amount of at least one element selected from the impurity elements, particularly Fe, Ag and Ni among the impurity elements contained in the Cu ball 1 is within a range from 5.0 ppm by mass or more to 50.0 ppm by mass or lower. Namely, when containing any one of Fe, Ag and Ni, it is preferable that content of such one element is within a range from 5.0 ppm by mass or more to 50.0 ppm by mass or lower. When containing any two or more elements of Fe, Ag and Ni, it is preferable that contents of such two or more elements are within a range from 5.0 ppm by mass or more to 50.0 ppm by mass or lower. Since Fe, Ag and Ni become crystal cores in a melting step of the manufacturing steps of the Cu ball 1, the Cu ball 1 having high sphericity can be manufactured if the Cu contains at least a predetermined amount of Fe, Ag or Ni. Therefore, at least any one element of Fe, Ag and Ni is an important element for estimating contents of impurity elements. In addition, a total amount of at least one element selected from a group of Fe, Ag and Ni in a range of 5.0 ppm by mass or more to 50.0 ppm by mass or lower enables discoloration of the Cu ball 1 to be suppressed and enables any desired Vickers hardness of the Cu ball 1 to be realized, even when not performing any annealing step to recrystallize the Cu ball 1 slowly by slow cooling after the Cu ball 1 is slowly heated.

<Content of S: 0 ppm by Mass or More to 1.0 ppm by Mass or Lower>

Since the Cu ball 1 containing at least a predetermined amount of S forms a sulfide or a sulfur oxide when heating the ball so that it is easy to discolor and the wettability thereof deteriorates, the content of S may be required to be within a range from 0 ppm by mass or more to 1.0 ppm by mass or lower. The more the Cu ball 1 has many sulfides or sulfur oxides formed, the lightness of a surface of the Cu ball becomes dark. Therefore, when a measurement result of the lightness of the surface of the Cu ball indicates a predetermined value or less, it is determined that the formation of the sulfide or the sulfur oxide is suppressed and the wettability thereof is good, which will be described later.

<Content of P: 0 ppm by Mass or More and Less than 3.0 ppm by Mass>

P may be changed to phosphoric acid and a Cu complex, so that it may exert a bad influence upon the Cu ball 1. Since the Cu ball containing a predetermined amount of P has high hardness, it is preferable that the content of P is 0 ppm by mass or more and less than 3.0 ppm by mass. It is more preferable that the content of P is less than 1.0 ppm by mass.

<Other Impurity Elements>

The impurity elements contained in the Cu ball 1 such as Sb, Bi, Zn, Al, As, Cd, Pb, In, Sn, Au and the like other than the above-mentioned impurity elements (hereinafter, referred to as "other impurity elements") have preferably respective contents which are 0 ppm by mass or more and less than 50.0 ppm by mass.

In addition, as described above, the Cu ball 1 contains at least one element selected from a group of Fe, Ag and Ni as a necessary element. Since the Cu ball 1, however, cannot prevent any elements other than Fe, Ag and Ni from mixing thereto considering the current technology, the Cu ball 1 substantially contains any other impurity elements than Fe, Ag and Ni. Note, however, that when the contents of the other impurity elements is less than 1 ppm by mass, any effect or influence by the addition of each element is hard to appear. In addition, when the elements contained in the Cu ball are analyzed but the contents of the other impurity elements are less than 1 ppm by mass, such a value is an undetectable one of the analyzer. Therefore, when a total amount of at least one element selected from a group of Fe, Ag and Ni is 50 ppm by mass and the contents of the other impurity elements are less than 1 ppm by mass, it is estimated that the purity of the Cu ball 1 is substantially 99.995% (4N5) by mass. Further, when a total amount of at least one element selected from the group of Fe, Ag and Ni is 5 ppm by mass and the contents of the other impurity elements are less than 1 ppm by mass, it is estimated that the purity of the Cu ball 1 is substantially 99.9995% (5N5) by mass.

<The Vickers Hardness of Cu Ball: 55.5 HV or Lower>

The Vickers hardness of the Cu ball 1 is preferably 55.5 HV or lower. This is because the durability against external stress becomes low, the impact resistance to dropping gets worse, and cracks are generated easily, in a case where the Vickers hardness is large. This is also because, in a case where the auxiliary force such as pressurization is applied when forming three-dimensional mounting bumps and joints, there is a possibility that a crash of electrode and the like may occur with the use of a hard Cu ball. Moreover, this is because, in a case where the Vickers hardness of Cu ball 1 is large, a crystal grain becomes smaller than a certain size and therefore, a deterioration of electrical conductivity may be caused. When the Vickers hardness of the Cu ball 1 is 55.5 HV or lower, the impact resistance to dropping is satisfactory, cracks are suppressed, a crash of electrode and the like is suppressed, and the degradation of the electrical conductivity of the Cu ball 1 is also suppressed. In this executed examples, the lower limit of the Vickers hardness may be more than 0 HV, preferably 20 HV or more.

<Alpha Dose of Cu Ball: 0.0200 Cph/Cm² or Lower>

The alpha dose of the Cu ball 1 is preferably 0.0200 cph/cm² or lower. This is alpha dose such that it is insignificant for any soft errors in the high-density mounting of the electronic components. The alpha dose is more preferably 0.0100 cph/cm² or lower, still more preferably 0.0050 cph/cm² or lower, further more preferably 0.0020 cph/cm² or lower, and most preferably 0.0010 cph/cm² or lower from the viewpoints of suppressing the soft error in the further high-density mounting of the electronic components. In order to suppress any soft errors by the alpha dose, the contents of radioactive isotope such as U, Th and the like are preferably lower than 5 ppb by mass.

<Discoloring Resistance of Cu Ball: 55 or More of Lightness>

The Cu ball 1 preferably has lightness that is 55 or more. The lightness is referred to as "L*" value" of L*a*b* color space. Since the Cu ball 1, on a surface of which a sulfide or a sulfur oxide derived from S is formed, has lower lightness, it is estimated that the formation of the sulfide or the sulfur oxide is sufficiently suppressed when the lightness is 55 or more. In addition, the wettability of the Cu ball 1 having lightness of 55 or more when the Cu ball 1 is installed is excellent. On the contrary, when the Cu ball 1 has lightness of less than 55, it is estimated that the formation of the sulfide or the sulfur oxide is not sufficiently suppressed. The sulfide or the sulfur oxide exerts any bad influence upon the Cu ball 1 and its wettability deteriorates when the Cu ball 1 is directly connected to the electrode. The deterioration of the wettability may lead to a generation of a condition that is not wetted or cause a self-alignment property thereof to deteriorate.

<Diameter of Cu Ball: 1 μm or More to 1000 μm or Lower>

A diameter of the Cu ball 1 is preferably 1 μm or more to 1000 μm or lower, more preferably, is 50 μm or more to 300 μm or lower. If the diameter is within this range, the spherical Cu ball 1 can be stably manufactured. Moreover, a shorted connection can be suppressed when a pitch between the terminals is narrow. Here, in a case where the Cu ball 1 is used for solder paste, a collection of "Cu balls" can be called as "Cu powder". In a case where the Cu ball is used for the Cu powder, it is preferable that the diameter of the Cu ball 1 is generally 1-300 μm.

The following will describe a metal layer 2 that covers the Cu ball 1 in each of the Cu core ball 11A according to the first embodiment of the present invention and the Cu core ball 11B according to the second embodiment of the present invention.

<Metal Layer>

The metal layer 2 is composed of, for example, Ni plating layer, Co plating layer, Fe plating layer, Pd plating layer and plating layer (single layer or multiple layers) including two or more elements selected from a group of Ni, Co, Fe and Pd. The metal layer 2 is not melted at a soldering temperature when using the Cu core ball 11A, 11B for the solder bump and remains therein, so that the metal layer 2 contributes to a height of the solder joint and the Cu core ball is configured to have high sphericity and less variation in diameter. In addition, from the viewpoints of suppressing the soft error, it is configured to reduce the alpha dose.

<Composition and Thickness of Metal Layer>

The metal layer 2 contains Ni, Co, Fe or Pd excluding any inevitable impurities when the metal layer 2 is composed of Ni, Co, Fe or Pd independently. The metal to be used for the metal layer 2 is not limited to an independent metal: Any alloy combining two or more elements selected from the group of Ni, Co, Fe and Pd may be used therefor. The metal layer 2 may be configured to have multiple layers. The multiple layers may be suitable combinations of a layer that is configured to contain Ni, Co, Fe or Pd independently and an alloy layer combining two or more elements selected from the group of Ni, Co, Fe and Pd. In addition, a second metal layer which is configured to contain metal itself or the alloy thereof other than the element selected from the group of Ni, Co, Fe and Pd in the metal layer 2 may cover a surface of the metal layer 2. The metal layer 2 and the second metal layer may include a predetermined amount of other element(s) so that it does not (they do not) have any influence upon a barrier function and/or magnetic function of Ni, Co, Fe and Pd. As the elements to be added, for example, Sn, Ag, Cu, In, Sb, Ge, P and the like are exemplified. The metal layer 2 or the second metal layer has thickness of, for example, 1 μm through 20 μm.

The following will describe a solder layer 3 that covers the metal layer 2 in the Cu core ball 11B according to the second embodiment of the present invention.

<Solder Layer>

The solder layer 3 contains a Sn plating layer or an alloy plating layer including a main component of Sn.

<Composition and Thickness of Solder Layer>

The solder constituting the solder layer 3 may have solder alloy composition that includes a main component of Sn in a case of an alloy, but otherwise it is not particularly limited. In addition, as the solder layer, a Sn plating film may be used. For example, Sn, Sn—Ag alloy, Sn—Cu alloy, Sn—Ag—Cu alloy, Sn—In alloy and an alloy containing them and predetermined alloy element(s) are exemplified. In every case, contents of Sn are 40% by mass or more. As the alloy element to be added, for example, Ag, Cu, In, Ni, Co, Sb, Ge, P, Fe, Bi, Pb, Zn, Ga and the like are exemplified. Among them, the alloy composition of the solder layer 3 is preferably Sn-3Ag-0.5Cu alloy from the viewpoints of the impact resistance to dropping. Use of the solder having low alpha dose in the solder layer 3 may be configured to be the Cu core ball 11B having low alpha dose. The thickness of the solder layer 3 is not particularly limited, but it is sufficient to be 100 μm or less on one side only, and it is more preferably to be 20 μm through 50 μm on one side only.

<Alpha Dose of Cu Core Ball: 0.0200 Cph/Cm² or Lower>

The alpha dose of each of the Cu core balls 11A, 11B according to the first and second embodiments of the present invention is 0.0200 cph/cm² or lower. This is alpha dose such that it is insignificant for any soft errors in the high-density mounting of the electronic components. The alpha dose of the Cu core ball 11A according to the first embodiment of the present invention is attained by a fact that the alpha dose of the metal layer 2 constituting the Cu core ball 11A is 0.0200 cph/cm² or lower. Therefore, the Cu core ball 11A according to the first embodiment of the present invention is covered by such metal layer 2 and thus, exhibits low alpha dose. The alpha dose of the Cu core ball 11B according to the second embodiment of the present invention is attained by a fact that the alpha dose of the metal layer 2 and the solder layer 3 constituting the Cu core ball 11B is 0.0200 cph/cm² or lower. Therefore, the Cu core ball 11B according to the second embodiment of the present invention is covered by the metal layer 2 and the solder layer 3 and thus, exhibits low alpha dose. The alpha dose thereof is preferably 0.0100 cph/cm² or lower, it is more preferably 0.0050 cph/cm² or lower, it is further preferably 0.0020 cph/cm² or lower, it is most preferably 0.0010 cph/cm² or lower, from the viewpoints of suppressing the soft error in the further high-density mounting of the electronic components. Contents of U and Th in the metal layer 2 and the solder layer 3 are respectively 5 ppb by mass or lower because the alpha dose of the Cu ball 1 is 0.0200 cph/cm² or lower. From viewpoints of suppressing any soft errors in a present or future high-density mounting, the contents of U and Th are preferably 2 ppb by mass or lower, respectively.

<Sphericity of Cu Core Ball: 0.95 or Higher>

For the Cu core ball 11A, in which the metal layer 2 covers the Cu ball 1, according to the first embodiment of the present invention and the Cu core ball 11B, in which the metal layer 2 and the solder layer 3 cover the Cu ball 1, according to the second embodiment of the present invention, the sphericity thereof is preferably 0.95 or higher, it is more preferably 0.98 or higher, and it is still more preferably 0.99 or higher. If the sphericity of each of the Cu core balls 11A, 11B is less than 0.95, the Cu core balls 11A, 11B respectively become an indeterminate shape. Therefore, when each of the Cu core balls 11A, 11B is mounted on an electrode and a reflow treatment is performed thereon, there may be a position gap of each of the Cu core balls 11A, 11B and a self-alignment property thereof becomes worse. If the sphericity of each of the Cu core balls 11A, 11B is 0.95 or higher, a self-alignment property thereof is maintained when each of the Cu core balls 11A, 11B is installed on electrode 100 of the semiconductor chip 10. Further, since the Cu ball 1 has sphericity of 0.95 or more and the Cu ball 1 and the metal layer 2 in the Cu core balls 11A, 11B are not melted at a soldering temperature, any variation in heights of the solder joints 50A, 50B is suppressed. This enables the poor joints between the semiconductor chip 10 and the printed circuit board 40 to be surely prevented.

<Magnetic Function of Metal Layer>

Since the metal layer 2 composed of ferromagnetic material covers the surface of the Cu ball 1 in each of the Cu core balls 11A, 11B, the Cu core balls 11A, 11B have magnetism as whole of each of the Cu core balls. Thus, the Cu core balls 11A, 11B having magnetism exhibit the following effect. Namely, in a case where the Cu core ball 11A, 11B is installed on the electrode using a transfer method, magnetic force by a magnet provided in a stage is utilized, so that the Cu core balls 11A, 11B spread on a mask mounted on a substrate are appropriately transferred into an opening of the mask. This allows the Cu core balls 11A, 11B to be prevented from being damaged and/or deformed by the transfer means or being contaminated because a spatula or a brush as a conventional transfer means does not directly contact any Cu core balls 11A, 11B. The alignment property when installing the Cu core ball 11A, 11B on the electrode is maintained because an action of the magnet adjusts a position of the Cu core ball 11A, 11B.

<Barrier Function of Metal Layer>

During the reflow, if Cu diffuses from Cu ball 1 to solder paste used for connecting the Cu core ball 11A, 11B and the electrode, a large amount of intermetallic compounds such as $Cu_6Sn_5$ and $Cu_3Sn_5$, which are solid but delicate, may be formed in the solder layer and a connection interface. When receiving any impact, a crack may develop, thereby destroying the connection portion. Accordingly, in order to obtain sufficient connection strength, it may be required to suppress the diffusion of Cu from the Cu ball 1 to the solder (Barrier Function). In the embodiments, the metal layer 2 functioning as a barrier layer is formed on a surface of the Cu ball 1 so that it is suppress to spread Cu from the Cu ball 1 to the solder of the solder paste.

<Solder Joint, Solder Paste and Formed Solder>

The solder paste is configured by containing the Cu core ball 11A, 11B in the solder. The formed solder is configured by spreading the Cu core ball 11A, 11B into solder. The Cu core ball 11A, 11B is used for forming the solder joint connecting the electrodes.

<Method of Manufacturing Cu Ball>

The following will describe an example of a method of manufacturing the Cu ball 1. The Cu material as material thereof is put on a plate having heat-resisting property (hereinafter, referred to as "heat-resisting plate") such as ceramics and is heated in a furnace together with the heat-resisting plate. There are many dimples each having a hemispheric bottom in the heat-resisting plate. A diameter of the dimple and a depth thereof are suitably set according to a diameter of the Cu ball 1. For example, the diameter thereof is 0.8 mm and the depth thereof is 0.88 mm. Further, the Cu materials each having a chip shape, which are obtained by cutting a fine wire made of Cu, are put into the dimples one by one in the heat-resisting plate. The heat-resisting plate in which the Cu material have been put into each of the dimples is heated at 1100-1300 degrees C. in the furnace into which ammonia decomposition gas is filled and heating process is performed thereon during 30 through 60 minutes. In this moment, when temperature in the furnace is more than the melting point of Cu, the Cu material is melted so that it becomes sphered. Thereafter, the interior of the furnace is cooled and the Cu ball 1 is formed by being cooled rapidly in each of the dimples of the heat-resisting plate.

Further, as other methods, there are an atomizing method in which the molten Cu is dropped down from an orifice pierced in a bottom of a melting pot and the droplet is rapidly cooled to a room temperature (25 degrees C., for example) to be sphered as the Cu ball 1 and a method in which thermal plasma heats cut metal of Cu at a temperature of 1000 degrees C. or more to be sphered.

For the method of manufacturing the Cu ball 1, the Cu material as a raw material of the Cu ball 1 may be heated at 800 through 1000 degrees C. before the Cu ball 1 is sphered.

As the Cu material that is a raw material of the Cu ball 1, for example, nugget, wire, plate material or the like can be used. The Cu material may have purity of more than 4N5 through not more than 6N from a viewpoint such that the purity in the Cu ball 1 is not too low.

In a case of using a Cu material having the further high purity, the heating treatment mentioned above is not performed and a retention temperature of the molten Cu may be lowered to approximately 1000 degrees C. as in a conventional way. Thus, the above-mentioned heating treatment may be omitted or changed according to the alpha dose or the purity in the Cu material. In addition, in a case that a Cu ball 1 having a high alpha dose or a deformed Cu ball 1 is manufactured, such a Cu ball 1 is available for reuse as raw materials so that furthermore the alpha dose can be decreased.

<Method of Manufacturing Cu Core Ball 11A>

As a method of forming the metal layer 2 on the manufactured Cu ball 1, a known electroplating method or the like may be adopted. When, for example, a Ni plating layer is formed, a Ni plating solution is adjusted by using Ni metal or Ni metal salt to a series of plating baths of Ni and the Cu ball 1 is dipped and deposited to the Ni plating solution, so that the Ni plating layer is formed on the surface of the Cu ball 1. As another method of forming the metal layer 2 such as Ni plating layer, a known electroless plating method or the like may be adopted.

<Method of Manufacturing Cu Core Ball 11B>

As a method of forming the metal layer 2 and the solder layer 3 on the manufactured Cu ball 1, a known electroplating method or the like may be adopted. When the solder layer 3 of the solder alloy is formed on a surface of the metal layer 2, a Sn plating solution is adjusted by using Sn metal or Sn metal salt to a series of plating baths of Sn alloys and the Cu ball 1 which has been covered with the metal layer 2 is dipped and deposited, so that the solder layer 3 is formed on the surface of the metal layer 2. As another method of forming the solder layer 3, a known electroless plating method or the like may be adopted.

EXECUTED EXAMPLES

The following will describe executed examples of the invention, but the invention is not limited thereto. The Cu balls of the executed examples and the comparison examples, each ball having compositions shown in Tables 1A, 1B and 2 were manufactured and the sphericity, the Vickers hardness, the alpha dose and the discoloring resistance of each of these Cu balls were measured. In addition, the metal layer 2 covered each of the Cu balls of the above-mentioned executed examples and comparison examples to prepare the Cu core balls of the executed examples and the comparison examples and the sphericity and the alpha dose of these Cu core balls were measured. In the following Tables, numerals without any units indicate ppm by mass or ppb by mass. Particularly, numerical values indicating a content ratio of Fe, Ag, Ni, P, S, Sb, Bi, Zn, Al, As, Cd, Pb, In, Sn and Au in the Tables indicate ppm by mass. A mark "<1" indicates that a content ratio of the corresponding impurity element in the Cu ball is less than 1 ppm by mass. Numerical values indicating a content ratio of U and Th in the Tables indicate ppb by mass. A mark "<5" indicates that a content ratio of the corresponding impurity element in the Cu ball is less than 5 ppb by mass. The "total amount of impurities" indicates a total ratio of impurity elements contained in the Cu ball.

<Manufacturing of Cu Ball>

Manufacturing conditions of the Cu balls were examined. The nugget materials as Cu materials which were an example of metal material were prepared. The Cu materials having the purity of 6N were used in the Executed Examples 1 through 13 and 22 and the Comparison Examples 1 through 12. The Cu materials having the purity of 5N were used in the Executed Examples 14 through 21. Each Cu material was put into a melting pot and then, the melting pot was heated up to temperature of 1200 degrees C. and this heating process was performed thereon during 45 minutes to melt the Cu material. The molten Cu was dropped down from an orifice pierced in the bottom of the melting pot. The generated droplets were rapidly cooled to a room temperature (18 degrees C.) so as to be sphered as the Cu balls. Thus, the Cu balls each having a mean diameter shown in the following Tables were manufactured. Although the element analysis can be performed with high accuracy using Inductively-coupled Plasma Source Mass Spectrometry (ICP-MS analysis) or Glow Discharge Mass Spectrometry (GD-MS analysis), ICP-MS analysis was used therefor in this examples.

<Manufacturing of Cu Core Ball>

The Cu core balls of the Executed Examples and the Comparison Examples were manufactured using the above-mentioned Cu balls of the Executed Examples and the Comparison Examples, each Cu core ball having Ni plating layer as the metal layer with thickness of 2 μm on one side only.

The following will describe a method of measuring and evaluating the sphericity and the alpha dose of each of the Cu balls and Cu core balls, and the Vickers hardness and the discoloring resistance of each of the Cu balls, more in detail.

<Sphericity>

The sphericity of each of the Cu balls and the Cu core balls was measured by CNC image measurement system. Equipment therefor was the ultra quick vision, ULTRA QV350-PRO manufactured by MITSUTOYO Corporation.

<Evaluation Criteria of Sphericity>

The evaluation criteria of sphericity of each of the Cu balls and the Cu core balls were shown as follows in each of the following Tables:

A symbol "OOO" indicated that the sphericity was 0.99 or higher;

A symbol "OO" indicated that the sphericity was 0.98 or higher to less than 0.99;

A symbol "O" indicated that the sphericity was 0.95 or higher to less than 0.98; and A symbol "X" indicated that the sphericity was less than 0.95.

<Vickers Hardness>

The Vickers hardness of the Cu ball was measured in accordance with "Vickers Hardness Test—Test method JIS Z2244". Equipment therefor was micro Vickers hardness testing machine, AKASHI micro hardness tester MVK-F 12001-Q manufactured by AKASHI Corporation.

<Evaluation Criteria of Vickers Hardness>

The evaluation criteria of Vickers hardness of each of the Cu balls were shown as follows in each of the following Tables:

A symbol "O" indicated that the Vickers hardness was within a range which was more than 0 HV to 55.5 HV or lower; and A symbol "X" indicated that the Vickers hardness exceeded 55.5 HV.

<Alpha Dose>

A measurement method of the alpha dose of each of the Cu balls and the Cu core balls was as follows. An alpha-ray measurement instrument of a gas-flow proportional counter was used to measure the alpha dose. A measurement sample was a 300 mm·times·300 mm flat shallow container with the Cu balls being bedded on a bottom thereof so as not to see the bottom. This measurement sample was put in the alpha-ray measurement instrument and was remained in an atmosphere of PR-10 gas flow for 24 hours, and then the alpha dose was measured. As for the Cu core balls, the alpha dose was measured using the same method.

<Evaluation Criteria of Alpha Dose>

The evaluation criteria of alpha dose of each of the Cu balls and the Cu core balls were shown as follows in each of the following Tables:

A symbol "O" indicated that the alpha dose was 0.0200 cph/cm$^2$ or lower; and

A symbol "X" indicated that the alpha dose exceeded 0.0200 cph/cm$^2$.

In addition, the PR-10 gas (argon 90% and methane 10%) used for the measurement was one such that it was kept for a period of three weeks or longer since a gas bottle was filled with the PR-10 gas. A reason why using the gas bottle kept for the period of three weeks or longer is based on JESD221 of JEDEC STANDARD-Alpha Radiation Measurement in Electronic Materials determined by JEDEC (Joint Electron Device Engineering Council) so as not to produce the alpha-ray by radon in the atmospheric air that enters into the gas bottle.

<Discoloring Resistance>

In order to measure the discoloring resistance of the Cu balls, the Cu balls were heated at 200 degrees C. for 420 seconds using a thermostat oven under the atmosphere and were measured about an alteration of lightness thereof. They were evaluated on whether or not they could satisfactorily endure aging variation. The lightness of the Cu balls was obtained from a color value (L*, a*, b*) by measuring spectral transmittance with the use of CM-3500d Spectrophotometer manufactured by Konica Minolta, following JIS Z 8722 (Methods of color measurement-Reflecting and transmitting objects) using D65 light source with 10 degrees field of view. It is to be noted that the color value (L*, a*, b*) is stipulated in JIS Z 8729 (Color specification-CIELAB and CIELUV color spaces). L* indicates lightness, a* indicates redness and b* indicates yellowness.

<Evaluation Criteria of Discoloring Resistance>

The evaluation criteria of discoloring resistance of each of the Cu balls were shown as follows in each of the following Tables:

A symbol "O" indicated that the lightness after 420 seconds was 55 or more; and

A symbol "X" indicated that the lightness after 420 seconds was less than 55.

<Total Evaluation>

The Cu ball which was evaluated as symbols "O", "OO" or "OOO" in every evaluation method and evaluation criteria about the sphericity, the Vickers hardness, the alpha dose and the discoloring resistance was evaluated as a symbol "O" in the total evaluation. On the other hand, the Cu ball which was evaluated as symbol "X" in any one of the evaluation method and evaluation criteria about the sphericity, the Vickers hardness, the alpha dose and the discoloring resistance was evaluated as a symbol "X" in the total evaluation.

The Cu core ball which was evaluated as symbols "O", "OO" or "OOO" in every evaluation method and evaluation criteria about the sphericity and the alpha dose was evaluated as a symbol "O" in the total evaluation. On the other hand, the Cu core ball which was evaluated as symbol "X" in any one of the evaluation method and evaluation criteria about the sphericity and the alpha dose was evaluated as a symbol "X" in the total evaluation.

Since the Vickers hardness of the Cu core ball depended on the Ni plating layer which was an example of the metal layer, the Vickers hardness of the Cu core ball was not evaluated. When in the Cu core ball, the Vickers hardness of the Cu ball is within a range regulated in the present invention, the impact resistance to dropping of the Cu core ball may be excellent to suppress any cracks, crush of the electrode and degradation of electric conductivity.

When the Vickers hardness of the Cu ball exceeds the range regulated in the present invention, the Cu core ball may have low durability to any external stress, so that the Cu core ball cannot address any issue such that the impact resistance to dropping gets worse and cracks are generated easily.

Accordingly, the Cu core balls using the Cu balls of the Comparison Examples 8-11, which had the Vickers hardness exceeding 66.6 HV, were not suitable for the evaluation of the Vickers hardness, so that they were evaluated as a symbol "X" in the total evaluation.

Since the discoloring resistance of the Cu core ball depended on the Ni plating layer which was an example of the metal layer, the discoloring resistance of the Cu core ball was not evaluated. When in the Cu core ball, the lightness of the Cu ball is within a range regulated in the present invention, a sulfide or a sulfur oxide on the surface of the Cu ball is suppressed and this is suitable for coating by the metal layer such as the Ni plating layer or the like.

When the lightness of the Cu ball falls below the range regulated in the present invention, the sulfide or the sulfur oxide on the surface of the Cu ball is not suppressed, so that this is not suitable for coating by the metal layer such as the Ni plating layer or the like.

Accordingly, the Cu core balls using the Cu balls of the Comparison Examples 1-6, which had the lightness after 420 seconds of less than 55, were not suitable for the evaluation of the discoloring resistance, so that they were evaluated as a symbol "X" in the total evaluation.

TABLE 1A

| | ELEMENT | EXECUTED EXAMPLE 1 | EXECUTED EXAMPLE 2 | EXECUTED EXAMPLE 3 | EXECUTED EXAMPLE 4 | EXECUTED EXAMPLE 5 | EXECUTED EXAMPLE 6 |
|---|---|---|---|---|---|---|---|
| Cu BALL | Cu | Bal | Bal | Bal | Bal | Bal | Bal |
| | Fe | 5.0 | 10.0 | 49.0 | 50.0 | <1 | <1 |
| | Ag | <1 | <1 | <1 | <1 | 5.0 | 10.0 |
| | Ni | <1 | <1 | <1 | <1 | <1 | <1 |
| | Fe + Ag + Ni | 5.0 | 10.0 | 49.0 | 50.0 | 5.0 | 10.0 |
| | S | <1 | <1 | <1 | <1 | <1 | <1 |
| | P | <1 | <1 | <1 | <1 | <1 | <1 |
| | Sb | <1 | <1 | <1 | <1 | <1 | <1 |
| | Bi | <1 | <1 | <1 | <1 | <1 | <1 |
| | Zn | <1 | <1 | <1 | <1 | <1 | <1 |
| | Al | <1 | <1 | <1 | <1 | <1 | <1 |
| | As | <1 | <1 | <1 | <1 | <1 | <1 |
| | Cd | <1 | <1 | <1 | <1 | <1 | <1 |
| | Pb | <1 | <1 | <1 | <1 | <1 | <1 |
| | Sn | <1 | <1 | <1 | <1 | <1 | <1 |
| | In | <1 | <1 | <1 | <1 | <1 | <1 |
| | Au | <1 | <1 | <1 | <1 | <1 | <1 |
| | U | <5 | <5 | <5 | <5 | <5 | <5 |
| | Th | <5 | <5 | <5 | <5 | <5 | <5 |
| | TOTAL AMOUNT OF IMPURITIES | 5.0 | 10.0 | 49.0 | 50.0 | 5.0 | 10.0 |

TABLE 1A-continued

|  |  |  |  |  |  |  |  |
|---|---|---|---|---|---|---|---|
| Cu CORE BALL | DIAMETER φ | 300 μm | 300 μm | 300 μm | 300 μm | 300 μm | 300 μm |
|  | Ni PLATING LAYER THICKNESS; ONE SIDE | 2 μm | 2 μm | 2 μm | 2 μm | 2 μm | 2 μm |
| EVALUATION OF Cu BALL | SPHERICITY | ○○○ | ○○○ | ○○○ | ○○○ | ○○○ | ○○○ |
|  | VICKERS HARDNESS | ○ | ○ | ○ | ○ | ○ | ○ |
|  | ALPHA DOSE | ○ | ○ | ○ | ○ | ○ | ○ |
|  | DISCOLORING RESISTANCE | ○ | ○ | ○ | ○ | ○ | ○ |
|  | TOTAL EVALUATION | ○ | ○ | ○ | ○ | ○ | ○ |
| EVALUATION OF Cu CORE BALL | SPHERICITY | ○○○ | ○○○ | ○○○ | ○○○ | ○○○ | ○○○ |
|  | VICKERS HARDNESS | — | — | — | — | — | — |
|  | ALPHA DOSE | ○ | ○ | ○ | ○ | ○ | ○ |
|  | DISCOLORING RESISTANCE | — | — | — | — | — | — |
|  | TOTAL EVALUATION | ○ | ○ | ○ | ○ | ○ | ○ |

|  | ELEMENT | EXECUTED EXAMPLE 7 | EXECUTED EXAMPLE 8 | EXECUTED EXAMPLE 9 | EXECUTED EXAMPLE 10 | EXECUTED EXAMPLE 11 | EXECUTED EXAMPLE 12 |
|---|---|---|---|---|---|---|---|
| Cu BALL | Cu | Bal | Bal | Bal | Bal | Bal | Bal |
|  | Fe | <1 | <1 | <1 | <1 | <1 | <1 |
|  | Ag | 49.0 | 50.0 | <1 | <1 | <1 | <1 |
|  | Ni | <1 | <1 | 5.0 | 10.0 | 49.0 | 50.0 |
|  | Fe + Ag + Ni | 49.0 | 50.0 | 5.0 | 10.0 | 49.0 | 50.0 |
|  | S | <1 | <1 | <1 | <1 | <1 | <1 |
|  | P | <1 | <1 | <1 | <1 | <1 | <1 |
|  | Sb | <1 | <1 | <1 | <1 | <1 | <1 |
|  | Bi | <1 | <1 | <1 | <1 | <1 | <1 |
|  | Zn | <1 | <1 | <1 | <1 | <1 | <1 |
|  | Al | <1 | <1 | <1 | <1 | <1 | <1 |
|  | As | <1 | <1 | <1 | <1 | <1 | <1 |
|  | Cd | <1 | <1 | <1 | <1 | <1 | <1 |
|  | Pb | <1 | <1 | <1 | <1 | <1 | <1 |
|  | Sn | <1 | <1 | <1 | <1 | <1 | <1 |
|  | In | <1 | <1 | <1 | <1 | <1 | <1 |
|  | Au | <1 | <1 | <1 | <1 | <1 | <1 |
|  | U | <5 | <5 | <5 | <5 | <5 | <5 |
|  | Th | <5 | <5 | <5 | <5 | <5 | <5 |
|  | TOTAL AMOUNT OF IMPURITIES | 49.0 | 50.0 | 5.0 | 10.0 | 49.0 | 50.0 |
| Cu CORE BALL | DIAMETER φ | 300 μm | 300 μm | 300 μm | 300 μm | 300 μm | 300 μm |
|  | Ni PLATING LAYER THICKNESS; ONE SIDE | 2 μm | 2 μm | 2 μm | 2 μm | 2 μm | 2 μm |
| EVALUATION OF Cu BALL | SPHERICITY | ○○○ | ○○○ | ○○○ | ○○○ | ○○○ | ○○○ |
|  | VICKERS HARDNESS | ○ | ○ | ○ | ○ | ○ | ○ |
|  | ALPHA DOSE | ○ | ○ | ○ | ○ | ○ | ○ |
|  | DISCOLORING RESISTANCE | ○ | ○ | ○ | ○ | ○ | ○ |
|  | TOTAL EVALUATION | ○ | ○ | ○ | ○ | ○ | ○ |
| EVALUATION OF Cu CORE BALL | SPHERICITY | ○○○ | ○○○ | ○○○ | ○○○ | ○○○ | ○○○ |
|  | VICKERS HARDNESS | — | — | — | — | — | — |
|  | ALPHA DOSE | ○ | ○ | ○ | ○ | ○ | ○ |
|  | DISCOLORING RESISTANCE | — | — | — | — | — | — |
|  | TOTAL EVALUATION | ○ | ○ | ○ | ○ | ○ | ○ |

TABLE 1B

|  | ELEMENT | EXECUTED EXAMPLE 13 | EXECUTED EXAMPLE 14 | EXECUTED EXAMPLE 15 | EXECUTED EXAMPLE 16 | EXECUTED EXAMPLE 17 |
|---|---|---|---|---|---|---|
| Cu BALL | Cu | Bal | Bal | Bal | Bal | Bal |
|  | Fe | 5.0 | 1.7 | 1.7 | 2.5 | 2.3 |
|  | Ag | 5.0 | 10.1 | 9.3 | 9.5 | 10.7 |
|  | Ni | 5.0 | 3.8 | 4.2 | 0.8 | 1.2 |

TABLE 1B-continued

|  |  |  |  |  |  |  |
|---|---|---|---|---|---|---|
|  | Fe + Ag + Ni | 15.0 | 15.6 | 15.2 | 12.8 | 14.2 |
|  | S | <1 | <1 | <1 | <1 | <1 |
|  | P | <1 | <1 | <1 | <1 | <1 |
|  | Sb | <1 | <1 | <1 | <1 | <1 |
|  | Bi | <1 | <1 | <1 | <1 | <1 |
|  | Zn | <1 | <1 | <1 | <1 | <1 |
|  | Al | <1 | <1 | <1 | <1 | <1 |
|  | As | <1 | <1 | <1 | <1 | <1 |
|  | Cd | <1 | <1 | <1 | <1 | <1 |
|  | Pb | <1 | <1 | <1 | <1 | <1 |
|  | Sn | <1 | <1 | <1 | <1 | <1 |
|  | In | <1 | <1 | <1 | <1 | <1 |
|  | Au | <1 | <1 | <1 | <1 | <1 |
|  | U | <5 | <5 | <5 | <5 | <5 |
|  | Th | <5 | <5 | <5 | <5 | <5 |
|  | TOTAL AMOUNT OF IMPURITIES | 15.0 | 15.6 | 15.2 | 12.8 | 14.2 |
|  | DIAMETER φ | 300 μm | 300 μm | 300 μm | 300 μm | 300 μm |
| Cu CORE BALL | Ni PLATING LAYER THICKNESS: ONE SIDE | 2 μm | 2 μm | 2 μm | 2 μm | 2 μm |
| EVALUATION OF Cu BALL | SPHERICITY | ○○○ | ○○○ | ○○○ | ○○○ | ○○○ |
|  | VICKERS HARDNESS | ○ | ○ | ○ | ○ | ○ |
|  | ALPHA DOSE | ○ | ○ | ○ | ○ | ○ |
|  | DISCOLORING RESISTANCE | ○ | ○ | ○ | ○ | ○ |
|  | TOTAL EVALUATION | ○ | ○ | ○ | ○ | ○ |
| EVALUATION OF Cu CORE BALL | SPHERICITY | ○○○ | ○○○ | ○○○ | ○○○ | ○○○ |
|  | VICKERS HARDNESS | — | — | — | — | — |
|  | ALPHA DOSE | ○ | ○ | ○ | ○ | ○ |
|  | DISCOLORING RESISTANCE | — | — | — | — | — |
|  | TOTAL EVALUATION | ○ | ○ | ○ | ○ | ○ |

|  | ELEMENT | EXECUTED EXAMPLE 18 | EXECUTED EXAMPLE 19 | EXECUTED EXAMPLE 20 | EXECUTED EXAMPLE 21 | EXECUTED EXAMPLE 22 |
|---|---|---|---|---|---|---|
| Cu BALL | Cu | Bal | Bal | Bal | Bal | Bal |
|  | Fe | 2.3 | 2.3 | 2.3 | 5.8 | 5.5 |
|  | Ag | 10.7 | 10.7 | 10.7 | <1 | 10.1 |
|  | Ni | 1.2 | 1.2 | 1.2 | <1 | 5.7 |
|  | Fe + Ag + Ni | 14.2 | 14.2 | 14.2 | 5.8 | 21.3 |
|  | S | <1 | <1 | <1 | <1 | <1 |
|  | P | <1 | <1 | <1 | <1 | 2.9 |
|  | Sb | <1 | <1 | <1 | <1 | <1 |
|  | Bi | <1 | <1 | <1 | <1 | <1 |
|  | Zn | <1 | <1 | <1 | <1 | <1 |
|  | Al | <1 | <1 | <1 | <1 | <1 |
|  | As | <1 | <1 | <1 | <1 | <1 |
|  | Cd | <1 | <1 | <1 | <1 | <1 |
|  | Pb | <1 | <1 | <1 | 13.2 | <1 |
|  | Sn | <1 | <1 | <1 | 30.3 | <1 |
|  | In | <1 | <1 | <1 | <1 | <1 |
|  | Au | <1 | <1 | <1 | <1 | <1 |
|  | U | <5 | <5 | <5 | <5 | <5 |
|  | Th | <5 | <5 | <5 | <5 | <5 |
|  | TOTAL AMOUNT OF IMPURITIES | 14.2 | 14.2 | 14.2 | 49.3 | 24.2 |
|  | DIAMETER φ | 200 μm | 100 μm | 50 μm | 50 μm | 300 μm |
| Cu CORE BALL | Ni PLATING LAYER THICKNESS: ONE SIDE | 2 μm | 2 μm | 2 μm | 2 μm | 2 μm |
| EVALUATION OF Cu BALL | SPHERICITY | ○○○ | ○○○ | ○○○ | ○○○ | ○○○ |
|  | VICKERS HARDNESS | ○ | ○ | ○ | ○ | ○ |
|  | ALPHA DOSE | ○ | ○ | ○ | ○ | ○ |
|  | DISCOLORING RESISTANCE | ○ | ○ | ○ | ○ | ○ |
|  | TOTAL EVALUATION | ○ | ○ | ○ | ○ | ○ |
| EVALUATION OF Cu CORE BALL | SPHERICITY | ○○○ | ○○○ | ○○○ | ○○○ | ○○○ |
|  | VICKERS HARDNESS | — | — | — | — | — |
|  | ALPHA DOSE | ○ | ○ | ○ | ○ | ○ |

TABLE 1B-continued

|  | | | | | |
|---|---|---|---|---|---|
| DISCOLORING RESISTANCE | — | — | — | — | — |
| TOTAL EVALUATION | ○ | ○ | ○ | ○ | ○ |

TABLE 2

|  | ELEMENT | COMPARISON EXAMPLE 1 | COMPARISON EXAMPLE 2 | COMPARISON EXAMPLE 3 | COMPARISON EXAMPLE 4 | COMPARISON EXAMPLE 5 | COMPARISON EXAMPLE 6 |
|---|---|---|---|---|---|---|---|
| Cu BALL | Cu | Bal | Bal | Bal | Bal | Bal | Bal |
|  | Fe | <1 | <1 | <1 | <1 | <1 | <1 |
|  | Ag | <1 | <1 | <1 | <1 | <1 | <1 |
|  | Ni | <1 | <1 | <1 | <1 | <1 | <1 |
|  | Fe + Ag + Ni | 0.0 | 0.0 | 0.0 | 0.0 | 0.0 | 0.0 |
|  | S | 10.0 | 15.0 | 20.0 | 25.0 | 30.0 | 35.0 |
|  | P | <1 | <1 | <1 | <1 | <1 | <1 |
|  | Sb | <1 | <1 | <1 | <1 | <1 | <1 |
|  | Bi | <1 | <1 | <1 | <1 | <1 | <1 |
|  | Zn | <1 | <1 | <1 | <1 | <1 | <1 |
|  | Al | <1 | <1 | <1 | <1 | <1 | <1 |
|  | As | <1 | <1 | <1 | <1 | <1 | <1 |
|  | Cd | <1 | <1 | <1 | <1 | <1 | <1 |
|  | Pb | <1 | <1 | <1 | <1 | <1 | <1 |
|  | Sn | <1 | <1 | <1 | <1 | <1 | <1 |
|  | In | <1 | <1 | <1 | <1 | <1 | <1 |
|  | Au | <1 | <1 | <1 | <1 | <1 | <1 |
|  | U | <5 | <5 | <5 | <5 | <5 | <5 |
|  | Th | <5 | <5 | <5 | <5 | <5 | <5 |
|  | TOTAL AMOUNT OF IMPURITIES | 10.0 | 15.0 | 20.0 | 25.0 | 30.0 | 35.0 |
|  | DIAMETER φ | 300 μm | 300 μm | 300 μm | 300 μm | 300 μm | 300 μm |
| Cu CORE BALL | Ni PLATING LAYER THICKNESS: ONE SIDE | 2 μm | 2 μm | 2 μm | 2 μm | 2 μm | 2 μm |
| EVALUATION OF Cu BALL | SPHERICITY | ○○ | ○○○ | ○○○ | ○○○ | ○○○ | ○○○ |
|  | VICKERS HARDNESS | ○ | ○ | ○ | ○ | ○ | ○ |
|  | ALPHA DOSE | ○ | ○ | ○ | ○ | ○ | ○ |
|  | DISCOLORING RESISTANCE | X | X | X | X | X | X |
|  | TOTAL EVALUATION | X | X | X | X | X | X |
| EVALUATION OF Cu CORE BALL | SPHERICITY | ○○ | ○○○ | ○○○ | ○○○ | ○○○ | ○○○ |
|  | VICKERS HARDNESS | — | — | — | — | — | — |
|  | ALPHA DOSE | ○ | ○ | ○ | ○ | ○ | ○ |
|  | DISCOLORING RESISTANCE | — | — | — | — | — | — |
|  | TOTAL EVALUATION | X | X | X | X | X | X |

|  | ELEMENT | COMPARISON EXAMPLE 7 | COMPARISON EXAMPLE 8 | COMPARISON EXAMPLE 9 | COMPARISON EXAMPLE 10 | COMPARISON EXAMPLE 11 | COMPARISON EXAMPLE 12 |
|---|---|---|---|---|---|---|---|
| Cu BALL | Cu | Bal | Bal | Bal | Bal | Bal | Bal |
|  | Fe | <1 | 50.0 | 4.2 | 52.0 | 5.7 | 1.2 |
|  | Ag | <1 | 50.0 | 29.1 | 51.7 | 30.5 | <1 |
|  | Ni | <1 | 50.0 | 14.7 | 49.9 | 12.3 | <1 |
|  | Fe + Ag + Ni | 0.0 | 150.0 | 48.0 | 153.6 | 48.5 | 1.2 |
|  | S | <1 | <1 | <1 | <1 | <1 | <1 |
|  | P | <1 | <1 | 211.5 | 10.2 | 199.9 | <1 |
|  | Sb | <1 | <1 | 23.3 | 20.5 | <1 | <1 |
|  | Bi | <1 | <1 | 51.9 | 17.9 | <1 | <1 |
|  | Zn | <1 | 13.0 | 5.7 | <1 | <1 | <1 |
|  | Al | <1 | <1 | <1 | <1 | <1 | <1 |
|  | As | <1 | <1 | 51.2 | <1 | <1 | <1 |
|  | Cd | <1 | <1 | 6.5 | <1 | <1 | <1 |
|  | Pb | <1 | 11.2 | 31.4 | <1 | <1 | <1 |
|  | Sn | <1 | 151.0 | 58.7 | <1 | <1 | <1 |
|  | In | <1 | <1 | <1 | <1 | <1 | <1 |
|  | Au | <1 | <1 | <1 | <1 | <1 | <1 |
|  | U | <5 | <5 | <5 | <5 | <5 | <5 |
|  | Th | <5 | <5 | <5 | <5 | <5 | <5 |

TABLE 2-continued

|  |  |  |  |  |  |  |  |
|---|---|---|---|---|---|---|---|
| | TOTAL AMOUNT OF IMPURITIES | 0.0 | 325.2 | 488.2 | 202.2 | 248.4 | 1.2 |
| Cu CORE BALL | DIAMETER φ | 300 μm | 300 μm | 300 μm | 300 μm | 300 μm | 300 μm |
| | Ni PLATING LAYER THICKNESS: ONE SIDE | 2 μm | 2 μm | 2 μm | 2 μm | 2 μm | 2 μm |
| EVALUATION OF Cu BALL | SPHERICITY | X | ○○○ | ○○○ | ○○○ | ○○○ | X |
| | VICKERS HARDNESS | ○ | X | X | X | X | ○ |
| | ALPHA DOSE | ○ | ○ | ○ | ○ | ○ | ○ |
| | DISCOLORING RESISTANCE | ○ | ○ | ○ | ○ | ○ | ○ |
| | TOTAL EVALUATION | X | X | X | X | X | X |
| EVALUATION OF Cu CORE BALL | SPHERICITY | X | ○○○ | ○○○ | ○○○ | ○○○ | X |
| | VICKERS HARDNESS | — | — | — | — | — | — |
| | ALPHA DOSE | ○ | ○ | ○ | ○ | ○ | ○ |
| | DISCOLORING RESISTANCE | — | — | — | — | — | — |
| | TOTAL EVALUATION | X | X | X | X | X | X |

As shown in Tables 1A and 1B, all of the Cu balls of the executed examples, having the purity which was 4N5 or higher to 5N5 or lower and the Cu core balls in which the Ni plating layers covered the Cu balls of the executed examples exhibited excellent results in their total evaluations. Therefore, it has been understood that the purity of the Cu ball is preferably 4N5 or higher to 5N5 or lower.

As shown in the Executed Examples 1 through 12 and 21, the Cu balls thereof, having the purity which was 4N5 or higher to 5N5 or lower and containing Fe, Ag or Ni in an amount of 5.0 ppm by mass or more to 50.0 ppm by mass or lower and the Cu core balls in which the Ni plating layers covered the Cu balls of such Executed Examples exhibited excellent results in their total evaluations. As shown in the Executed Examples 13 through 20 and 22, the Cu balls thereof, having the purity which was 4N5 or higher to 5N5 or lower and containing Fe, Ag and Ni in a total amount of 5.0 ppm by mass or more to 50.0 ppm by mass or lower and the Cu core balls in which the Ni plating layers covered the Cu balls of such Executed Examples exhibited excellent results in their total evaluations. In addition, not shown in the Tables, the Cu balls changing content of Fe to be 0 ppm by mass or higher to less than 5.0 ppm by mass, content of Ag to be 0 ppm by mass or higher to less than 5.0 ppm by mass, and content of Ni to be 0 ppm by mass or higher to less than 5.0 ppm by mass, from those of the Executed Examples 1 and 18 through 22 and containing Fe, Ag and Ni in a total amount of 5.0 ppm by mass or more and the Cu core balls in which the Ni plating layers covered the Cu balls of such Executed Examples also exhibited excellent results in their total evaluations.

As shown in the Executed Example 21, the Cu balls containing Fe, Ag or Ni in an amount of 5.0 ppm by mass or higher to 50.0 ppm by mass or lower and containing other impurity elements such as Sb, Bi, Zn, Al, As, Cd, Pb, In, Sn and Au in an amount of 50.0 ppm by mass or less, respectively and the Cu core balls in which the Ni plating layers covered the Cu balls of such an Executed Example also exhibited excellent results in the total evaluation thereof.

On the contrary, the Cu ball of the Comparison Example 7 containing Fe, Ag and Ni in a total amount of less than 5.0 ppm by mass, containing U and Th in an amount of less than 5 ppb by mass and containing other impurity elements in an amount of less than 1 ppm by mass and the Cu core balls in which the Ni plating layers covered the Cu balls of such a Comparison Example 7 exhibited the sphericity of less than 0.95. Moreover, the Cu ball of the Comparison Example 12 containing any impurity elements but containing at least one element selected from the group of Fe, Ag and Ni in a total amount of less than 5.0 ppm by mass, and the Cu core balls in which the Ni plating layers covered the Cu balls of such a Comparison Example 12 also exhibited the sphericity of less than 0.98. From these results, it has been understood that the Cu ball containing at least one element selected from the group of Fe, Ag and Ni in a total amount of less than 5.0 ppm by mass, and the Cu core balls in which the Ni plating layers covered such a Cu ball do not realize any high sphericity.

The Cu ball of the Comparison Example 10 containing Fe, Ag and Ni in a total amount of 153.6 ppm by mass and other impurity elements in an amount of 50 ppm by mass or lower had Vickers hardness exceeding 55.5 HV, so that it did not exhibit any excellent results. The Cu ball of the Comparison Example 8 containing Fe, Ag and Ni in a total amount of 150.0 ppm by mass or more and other impurity elements in an amount of largely exceeding 50.0 ppm by mass, particularly Sn in an amount of 151.0 ppm by mass, had the Vickers hardness exceeding 55.5 HV, so that it did not also exhibit any excellent results. Therefore, it has been understood that even when the Cu ball has the purity which is 4N5 or more to 5N5 or lower, if the Cu ball contains at least one element selected from the group of Fe, Ag and Ni in a total amount exceeding 50.0 ppm by mass, the Cu ball has large Vickers hardness, thereby failing to realize low hardness. Thus, when the Vickers hardness of the Cu ball exceeds the range regulated in the present invention, the Cu ball may have low durability to any external stress, so that the Cu core ball cannot address any issue such that the impact resistance to dropping gets worse and cracks are generated easily. In addition, it has been estimated that the Cu ball preferably contains respective other impurity elements in a range of not exceeding 50.0 ppm by mass.

From these results, it has been understood that the Cu ball having the purity which was 4N5 or higher to 5N5 or lower and containing at least one element selected from the group of Fe, Ag and Ni in a total amount of 5.0 ppm by mass or more to 50.0 ppm by mass or lower realizes high sphericity and low hardness, and suppresses discoloration. The Cu core ball in which the Ni plating layer covers such a Cu ball realizes high sphericity. In addition, since the Cu ball realizes low hardness, the Cu core ball is also excellent for the impact resistance to dropping to suppress any cracks, thereby suppressing a crash of electrode and the like and the degradation of the electrical conductivity thereof. Since the discoloration of the Cu ball is suppressed, this is suitable for the coating by the metal layer such as the Ni plating layer or the like. It is preferable that contents of other impurity elements are respectively 50.0 ppm by mass or lower.

The Cu balls of the Executed Examples 17 through 20 had the same composition but different diameters. They all exhibited excellent results in their total evaluations. The Cu core balls in which the Ni plating layer covered the Cu balls of the Executed Examples 17 through 20 all also exhibited excellent results in their total evaluations. The Cu balls each having the same composition as those of the Executed Examples and having a diameter which is 1 μm or larger to 1000 μm or lower, not shown in the Tables, all exhibited excellent results in their total evaluations. Therefore, it has been understood that the diameter of the Cu ball is preferably 1 μm or larger to 1000 μm or lower, particularly, it is more preferably 50 μm or larger to 300 μm or lower.

The Cu ball of the Executed Example 22 containing Fe, Ag and Ni in a total amount of 5.0 ppm by mass or more to 50.0 ppm by mass or lower and P in an amount of 2.9 ppm by mass exhibited excellent results in the total evaluation thereof. The Cu core ball in which the Ni plating layer covers the Cu ball of the Executed Example 22 also exhibited excellent results. The Cu ball of the Comparison Example 11 containing Fe, Ag and Ni in a total amount of 50.0 ppm by mass or less, which is similar to the Cu ball of the Executed Example 22, had the Vickers hardness exceeding 55.5 HV, so that it exhibited a result that is different from that of the Cu ball of the Executed Example 22. The Cu ball of the Comparison Example 9 also had the Vickers hardness exceeding 55.5 HV. This is because the Cu balls of the Comparison Examples 9 and 11 contain a large amount of P. From this result, it has been understood that when increasing a content of P, the Vickers hardness becomes large. Therefore, it has been understood that the content of P in the Cu ball is preferably less than 3 ppm by mass, particularly, it is more preferably less than 1 ppm by mass.

The Cu balls and the Cu core balls of the Executed Examples exhibited alpha dose of 0.0200 cph/cm$^2$ or lower. Therefore, when using the Cu balls and Cu core balls of the Executed Examples in the high-density mounting of the electronic components, it may be suppress any soft errors.

The Cu ball of the Comparison Example 7 exhibited excellent results about the discoloring resistance while the Cu balls of the Comparison Examples 1 through 6 did not exhibit any excellent results about the discoloring resistance. When comparing each of the Cu balls of the Comparison Examples 1 through 6 with the Cu ball of the Comparison Example 7, there was only a difference in the content of S on their compositions. Therefore, it has been understood that in order to obtain an excellent result of the discoloring resistance, the content of S may be required to be less than 1 ppm by mass. Because the Cu balls of all of the Executed Examples contained S of less than 1 ppm by mass, it has been understood that the content of S is preferably less than 1 ppm by mass.

The following will describe a relationship between content of S and the discoloring resistance. In order to confirming this relationship, the Cu balls of the Executed Example 14 and the Comparison Examples 1 and 5 were heated at 200 degrees C. but these Cu balls were photographed before the heating, at 60 seconds after the heating, at 180 seconds after the heating and at 420 seconds after the heating. The lightness of each of the photographed Cu balls was measured. Table 3 indicates the relationship between a period of time when the Cu balls are heated and lightness and FIG. 5 shows a graph of this relationship.

TABLE 3

| No. | Ini | 200° C.-HEATING TIME [sec] | | |
|---|---|---|---|---|
| | 0 | 60 | 180 | 420 |
| EXECUTED EXAMPLE 14 | 64.2 | 64.0 | 62.8 | 55.1 |
| COMPARISON EXAMPLE 1 | 63.8 | 63.8 | 61.1 | 49.5 |
| COMPARISON EXAMPLE 5 | 65.1 | 63.2 | 60.0 | 42.3 |

From this Table 3, in a case of comparing the lightness of the Cu balls before the heating with the lightness of the Cu balls at 420 seconds after the heating, the lightness of each of the Cu balls of the Executed Example 14 and the Comparison Examples 1 and 5 exhibited values near 64 or 65 before the heating. At 420 seconds after the heating, however, the Cu ball of the Comparison Example 5 containing S of 30.0 ppm by mass exhibited the lowest lightness, the Cu ball of the Comparison Example 1 containing S of 10.0 ppm by mass exhibited the lower lightness, and the Cu ball of the Executed Example 14 containing S of less than 1 ppm by mass exhibited the low lightness. Therefore, it has been understood that the more the content of S is, the less the lightness after the heating is. Since the Cu balls of the Comparison Examples 1 and 5 exhibited the lightness below 55, it has been understood that the Cu ball containing S of 10.0 ppm by mass or more forms a sulfide or a sulfur oxide when heating the Cu ball, so that it is easy to discolor. When the Cu ball contains S within a range from 0 ppm by mass or more to 1.0 ppm by mass or lower, it has been understood that the Cu ball suppresses formation of the sulfide or the sulfur oxide, thereby enabling wettability thereof to be improved. It is to be noted that when installing the Cu ball of the Executed Example 14 on the electrode, the Cu ball exhibited good wettability.

The Cu balls of these Executed Examples, which have the purity which is 4N5 or higher to 5N5 or lower, contains at least one element selected from a group of Fe, Ag and Ni in a total amount of 5.0 ppm by mass or more to 50.0 ppm by mass or lower, contains S in an amount of 0 ppm by mass or more to 1.0 ppm by mass or lower and P in an amount of 0 ppm by mass or more to less than 3.0 ppm by mass, all exhibited sphericity which is 0.98 or higher, thereby realizing high sphericity. The realization of the high sphericity allows the self-alignment property when installing the Cu ball on the electrode to be maintained and allows variation of the heights of the Cu balls to be suppressed. The same effect is obtained in the Cu core balls in which the metal layer covers each of the Cu balls of the Executed Examples and the Cu core balls in which the solder layer further covers the metal layer.

Since the Cu balls of the Executed Examples all exhibited the Vickers hardness of 55 HV or less, they realize low hardness. By realizing the low hardness, it is possible to improve the impact resistance to dropping of the Cu ball. The realization of low hardness in the Cu ball enables the Cu core balls in which the metal layer covers each of the Cu balls of the Executed Examples and the Cu core balls in which the solder layer further covers the metal layer to be made the impact resistance to dropping thereof excellent, thereby suppressing any cracks, a crash of electrode and the like and the degradation of the electrical conductivity thereof.

In addition, the discoloration was suppressed in all of the Cu balls of the Executed Examples. By suppressing the discoloration of the Cu balls, it is possible to suppress a bad influence upon the Cu ball based on the sulfide or the sulfur oxide and improve the wettability the Cu ball when it is installed on the electrode. By the suppression of the discoloration of the Cu ball, this is suitable for coating with the metal layer such as the Ni plating layer or the like.

Further, although as the Cu material of the Executed Examples, the Cu balls having the purity of 4N5 or more and 5N5 or lower have been manufactured using the Cu nugget material having the purity exceeding 4N5 to 6N or lower, both of the Cu balls and the Cu core balls exhibited excellent results in their total evaluations when using the wire material or plate material having the purity exceeding 4N5 to 6N or lower.

The description of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A Cu core ball comprising:
   a Cu ball, and
   one or more metal layer for covering a surface of the Cu ball, each layer including one or more element selected from a group of Ni, Co, Fe and Pd,
   wherein the Cu ball contains at least one element selected from a group of Fe, Ag and Ni in a total amount of 5.0 ppm by mass or more to 50.0 ppm by mass or lower, S in an amount of 0 ppm by mass or more to 1.0 ppm by mass or lower, P in an amount of 0 ppm by mass or more to less than 1.0 ppm by mass, and remainder of Cu and inevitable impurities,
   wherein the Cu ball contains purity which is 99.995% by mass or higher to 99.9995% by mass or lower, and sphericity which is 0.95 or higher, and
   wherein the Cu ball contains a diameter of 1 µm or more to 1000 µm or lower.

2. The Cu core ball according to claim 1 wherein the sphericity thereof is 0.98 or higher.

3. The Cu core ball according to claim 1 wherein the sphericity thereof is 0.99 or higher.

4. The Cu core ball according to claim 1 wherein the Cu core ball contains alpha dose which is 0.0200 cph/cm$^2$ or lower.

5. The Cu core ball according to claim 1 wherein the Cu core ball contains alpha dose which is 0.0010 cph/cm$^2$ or lower.

6. The Cu core ball according to claim 1, further containing a solder layer which covers a surface of the metal layer wherein the sphericity of the Cu core ball is 0.95 or higher.

7. The Cu core ball according to claim 6 wherein the sphericity of the Cu core ball is 0.98 or higher.

8. The Cu core ball according to claim 6 wherein the sphericity of the Cu core ball is 0.99 or higher.

9. The Cu core ball according to claim 6 wherein the Cu core ball contains alpha dose which is 0.0200 cph/cm$^2$ or lower.

10. The Cu core ball according to claim 6 wherein the Cu core ball contains alpha dose which is 0.0010 cph/cm$^2$ or lower.

11. A solder joint formed from the Cu core ball according to claim 1.

12. The solder joint according to claim 11, the Cu core ball further containing a solder layer which covers a surface of the metal layer wherein the sphericity of the Cu core ball is 0.95 or higher.

13. Solder paste comprising the Cu core ball according to claim 1.

14. The solder paste according to claim 13, the Cu core ball further containing a solder layer which covers a surface of the metal layer wherein the sphericity of the Cu core ball is 0.95 or higher.

15. Formed solder comprising the Cu core ball according to claim 1.

16. The formed solder according to claim 15, the Cu core ball further containing a solder layer which covers a surface of the metal layer wherein the sphericity of the Cu core ball is 0.95 or higher.

* * * * *